(12) United States Patent
Rickman et al.

(10) Patent No.: US 12,233,433 B2
(45) Date of Patent: Feb. 25, 2025

(54) UNIFORM THIN FILM DEPOSITION FOR POLY-P-XYLYLENE

(71) Applicant: RAYTHEON COMPANY, Waltham, MA (US)

(72) Inventors: Amanda Rickman, Garland, TX (US); James R. Smith, Princeton, TX (US)

(73) Assignee: RAYTHEON COMPANY, Waltham, MA (US)

( * ) Notice: Subject to any disclaimer, the term of this patent is extended or adjusted under 35 U.S.C. 154(b) by 886 days.

(21) Appl. No.: 15/964,959

(22) Filed: Apr. 27, 2018

(65) Prior Publication Data

US 2019/0329286 A1 Oct. 31, 2019

(51) Int. Cl.
*B05D 1/00* (2006.01)
*C23C 16/46* (2006.01)

(52) U.S. Cl.
CPC ............... *B05D 1/60* (2013.01); *C23C 16/46* (2013.01)

(58) Field of Classification Search
CPC .. B05D 1/60; B05D 3/02; C23C 16/46; C23C 16/452; C23C 16/4583
USPC ................................... 118/715, 728
See application file for complete search history.

(56) References Cited

U.S. PATENT DOCUMENTS

| | | |
|---|---|---|
| 4,495,889 A | 1/1985 | Riley |
| 5,536,319 A | 7/1996 | Wary et al. |
| 5,603,772 A * | 2/1997 | Ide ............................ C23C 8/10 |
| | | 118/500 |
| 5,806,319 A | 9/1998 | Wary et al. |
| 5,958,510 A | 9/1999 | Sivaramakrishnam et al. |
| 6,140,456 A * | 10/2000 | Lee ....................... C08G 61/025 |
| | | 528/196 |
| 6,143,361 A * | 11/2000 | Near .................... C23C 16/4412 |
| | | 118/715 |
| 6,174,377 B1 * | 1/2001 | Doering .................. C30B 25/14 |
| | | 118/729 |
| 6,688,375 B1 * | 2/2004 | Turner .................... C23C 16/46 |
| | | 165/48.1 |
| 6,733,592 B2 * | 5/2004 | Fujikawa .......... H01L 21/67109 |
| | | 118/715 |

(Continued)

FOREIGN PATENT DOCUMENTS

TW 201022471 A1 6/2010

OTHER PUBLICATIONS

NN6306114, Diffusion Using a Ternary Alloy Source, IBM Technical Disclosure Bulletin, Jun. 1963 vol. 6 Issue No. 1, p. 114 (Year: 1963).*

(Continued)

*Primary Examiner* — Jeffrie R Lund
(74) *Attorney, Agent, or Firm* — CANTOR COLBURN LLP (57) ABSTRACT

Embodiments of the invention are directed to a deposition chamber for forming a poly-para-xylylene film. A non-limiting example of the deposition chamber includes a chamber body, an inlet coupling the chamber body to a furnace, and an outlet coupling the chamber body to a vacuum pump. The deposition chamber includes at least one heating element arranged on a surface of the chamber body. The heating element is configured to raise an internal temperature of the deposition chamber body to a substantially uniform internal temperature across an entire internal volume of the chamber body.

8 Claims, 8 Drawing Sheets

(56) References Cited

U.S. PATENT DOCUMENTS

| | | | | |
|---|---|---|---|---|
| 6,863,732 | B2* | 3/2005 | Asano | C30B 33/005 |
| | | | | 118/715 |
| 7,713,355 | B2* | 5/2010 | Zehavi | C23C 16/4583 |
| | | | | 118/728 |
| 9,297,070 | B2* | 3/2016 | Auger | C23C 16/4412 |
| 10,808,318 | B2* | 10/2020 | Hanashima | C23C 16/45546 |
| 2002/0175160 | A1* | 11/2002 | Bagley | H01L 21/6875 |
| | | | | 219/390 |
| 2003/0188683 | A1* | 10/2003 | Lee | B01J 19/123 |
| | | | | 118/50.1 |
| 2003/0196680 | A1* | 10/2003 | Lee | C23C 16/452 |
| | | | | 134/1.1 |
| 2003/0198578 | A1* | 10/2003 | Lee | B01J 19/1887 |
| | | | | 422/138 |
| 2004/0055539 | A1* | 3/2004 | Lee | B05D 1/60 |
| | | | | 118/724 |
| 2004/0226513 | A1* | 11/2004 | Inagawa | H01L 21/67109 |
| | | | | 118/724 |
| 2006/0019415 | A1* | 1/2006 | Jaiswal | H01L 28/20 |
| | | | | 438/14 |
| 2007/0167029 | A1* | 7/2007 | Kowalski | H01L 21/02238 |
| | | | | 438/769 |
| 2007/0231485 | A1* | 10/2007 | Moffat | B05D 7/24 |
| | | | | 427/248.1 |
| 2008/0160192 | A1* | 7/2008 | Thebault | C23C 16/45593 |
| | | | | 427/249.2 |
| 2008/0264343 | A1* | 10/2008 | Hagihara | H01L 21/67309 |
| | | | | 118/728 |
| 2009/0120365 | A1* | 5/2009 | Suda | H01J 37/32559 |
| | | | | 118/722 |
| 2010/0166955 | A1* | 7/2010 | Becker | C23C 16/45504 |
| | | | | 427/248.1 |
| 2010/0184297 | A1* | 7/2010 | Takagi | H01L 21/67069 |
| | | | | 438/706 |
| 2010/0203260 | A1* | 8/2010 | Moffat | B05D 1/60 |
| | | | | 427/535 |
| 2012/0067274 | A1* | 3/2012 | Hara | C30B 25/08 |
| | | | | 117/88 |
| 2014/0004715 | A1* | 1/2014 | Obu | H01L 21/02211 |
| | | | | 438/787 |
| 2014/0360430 | A1* | 12/2014 | Armour | C23C 16/4586 |
| | | | | 118/725 |
| 2015/0191628 | A1* | 7/2015 | Chen | B05D 1/60 |
| | | | | 428/435 |
| 2016/0060763 | A1* | 3/2016 | Yuan | C23C 16/46 |
| | | | | 428/446 |
| 2016/0186320 | A1* | 6/2016 | Cho | C23C 16/545 |
| | | | | 118/719 |
| 2016/0276206 | A1* | 9/2016 | Kaneko | C23C 16/45591 |
| 2016/0338146 | A1* | 11/2016 | Emami | F27D 11/02 |
| 2017/0334773 | A1* | 11/2017 | Katayama | C03C 3/093 |
| 2019/0329285 | A1* | 10/2019 | Chambre | C23C 14/12 |
| 2019/0329286 | A1* | 10/2019 | Rickman | B05D 1/60 |

OTHER PUBLICATIONS

International Application No. PCT/US19/028609; Filing Date Apr. 23, 2019; Written Opinion issued Sep. 4, 2019; 7 pages.

International Application No. PCT/US19/028609; Filing Date Apr. 23, 2019; International Search Report issued Sep. 4, 2019; 16 pages.

Curtiss-Wright; Para Tech Coating; Other Parylene Machines; [first retrieved on Apr. 25, 2018]; retrieved from Internet http://www.parylene.com/Equipment-Dimer/Equipment-Supplies/Equipment/Model-4000V.

Electronic Diener Plasma-Surface-Technology; Parylene P 300; [first retrieved on Apr. 25, 2018]; retrieved from Internet https://www.plasma.com/en/produkte/parylene-coating-systems/parylene-p300/.

Electronic Diener Plasma-Surface-Technology; Parylene P260; [first retrieved on Apr. 25, 2018]; retrieved from Internet https://www.plasma.com/en/produkte/parylene-coating-systems/parylene-p260/.

Paratronix, Inc.; Other Parylene Machines; [first retrieved on Apr. 25, 2018] retrieved from Internet http://paratronix.com/Equipment-H1092.htm.

Specialty Coating Systems, Inc.; [retrieved on Apr. 25, 2018]; retrieved from the Internet https://scscoatings.com/equipment/product-lines/parylene-coating-equipment/2060pc-parylene-coating-systems.

China National Intellectual Property Administration, First Office Action issued May 6, 2022 in Application No. 2019800276474, with English translation (9 pages).

Search Report issued in European Patent Application No. 19727140.6; Application Filing Date Apr. 23, 2019; Date of Mailing Oct. 16, 2024 (4 pages).

* cited by examiner

UNIFORM THIN FILM DEPOSITION FOR POLY-P-XYLYLENE

BACKGROUND

The present disclosure generally relates to poly-p-xylylene films, and more specifically, to uniform thickness poly-p-xylylene films.

Chemical vapor deposition (CVD) is a manufacturing process used in a wide array of applications. CVD is used to coat thin polymer films on surfaces of objects. Generally, the object to be coated is placed inside a vacuum chamber. A monomeric precursor is flowed into the chamber, which polymerizes onto the surface to form the coating. Various parameters of the process can be adjusted to control the thickness of the coating.

Parylene is the trade name for poly-para-xylylene (or poly-p-xylylene), which includes derivatives thereof. Such films are formed on objects using CVD. Parylene films are used, for example, in electronics, instrumentation, aerospace, medical applications, and engineering industries. Parylene films are advantageous because the coatings are generally formed at room temperature, adhere to many materials, are chemically and biologically inert, and have excellent electrical properties and thermal endurance. Parylene film formation processes are self-initiated and do not need a termination group, solvent, or catalyst. Different types of Parylenes include derivatives, for example, Parylene N, C, D, HT, AF-4, and F, each having unique different chemical, electrical, and physical properties.

SUMMARY

Embodiments of the invention are directed to a deposition chamber for forming a poly-para-xylylene film. A non-limiting example of the deposition chamber includes a chamber body, an inlet coupling the chamber body to a furnace, and an outlet coupling the chamber body to a vacuum pump. The deposition chamber includes at least one heating element arranged on a surface of the chamber body. The heating element is configured to raise an internal temperature of the deposition chamber body to a substantially uniform internal temperature across an entire internal volume of the chamber body.

Embodiments of the invention are further directed to a method for forming a poly-para-xylylene film in a deposition chamber. A non-limiting example of the method includes raising an internal temperature of the deposition chamber to a substantially uniform internal temperature. The method further includes polymerizing a monomeric precursor within the deposition chamber to form the poly-p-xylylene film on surfaces of an object within the deposition chamber.

Another non-limiting example of the method includes raising an internal temperature of the deposition chamber to a substantially uniform internal temperature. The method further includes polymerizing a monomeric precursor within the deposition chamber to form the poly-p-xylylene film on surfaces of an object within the deposition chamber. The poly-p-xylylene film has a thickness across an entire internal volume of the chamber that varies by less than 6%.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Turning now to an overview of technologies that are more specifically relevant to aspects of the invention, thermal non-uniformity in room temperature deposition chambers used to form poly-p-xylylene films by known CVD methods results in film thickness non-uniformity. Thermal non-uniformity in the deposition chambers results from various heat sources attached to the chamber that give rise to higher temperature pockets in the chamber. Heat sources coupled to the deposition chamber include, for example, adhesion promotion units, sensors, monitors, furnaces, etc. Non-uniform thickness polymeric films can present challenges because they limit the types of applications that the films can be used in. For example, generally, non-uniform thickness films can only be used in non-radio frequency (RF) applications or applications with loose mechanical tolerances. Non-uniform thickness films cannot be used where the thickness tolerance is critical, for example, in RF applications.

Prior attempts have been made to resolve the issue of temperature variations in the deposition chambers. However, such known methods also have drawbacks. For example, one prior method restricts the usable area of the deposition chamber to a small area where the temperature is substantially uniform. However, limiting the use of the chamber is inefficient and restricts the size of the part or batch size that can be coated within the chamber. In another prior approach, a partial heat blanket is used to distribute some heat in the chamber. However, only a small portion of the chamber is addressed with the partial blanket because heat from the furnace at the chamber inlet and other heat sources cannot be distributed. Other prior approaches include introducing heating or cooling elements at the platen level within the vacuum chamber for wafer-scaling coatings and/or 2D substrates. However, this approach cannot be scaled up to larger objects or to account for the whole chamber volume. Other prior approaches include cooling down the deposition chamber to speed up the polymerization process to increase the deposition rate and dimer usage efficiency; however, increasing the deposition rate also decreases film thickness uniformity.

Turning now to an overview of the aspects of the invention, one or more embodiments of the invention address the above-described shortcomings of the prior art by providing a method to control deposited poly-p-xylylene film thickness uniformity from outside the vacuum deposition chamber. The temperature of the entire deposition chamber, internally and externally, is raised in a controlled and uniform way. According to one or more embodiments, one or more heating elements is applied to a surface of the deposition chamber to provide a substantially uniform internal temperature across the entire internal volume of the chamber.

The above-described aspects of the invention address the shortcomings of the prior art by providing a method to form uniform poly-p-xylylene films at uniform elevated chamber temperatures (above room temperature) within the chamber during polymerization. The internal temperature of the entire area of the deposition chamber is substantially uniform, which enables the entire internal area of the chamber to be used for deposition. The uniform elevated chamber temperatures provide polymeric films with uniform thicknesses. The methods thus can be used to deposit films on both small and large three dimensional surfaces, which will reduce manufacturing and processing costs. Larger batches also can be coated, and substantially all of the chamber can be utilized. Other advantages include enabling tailorable RF properties over large objects by controlling the film thickness.

Figure 1A:
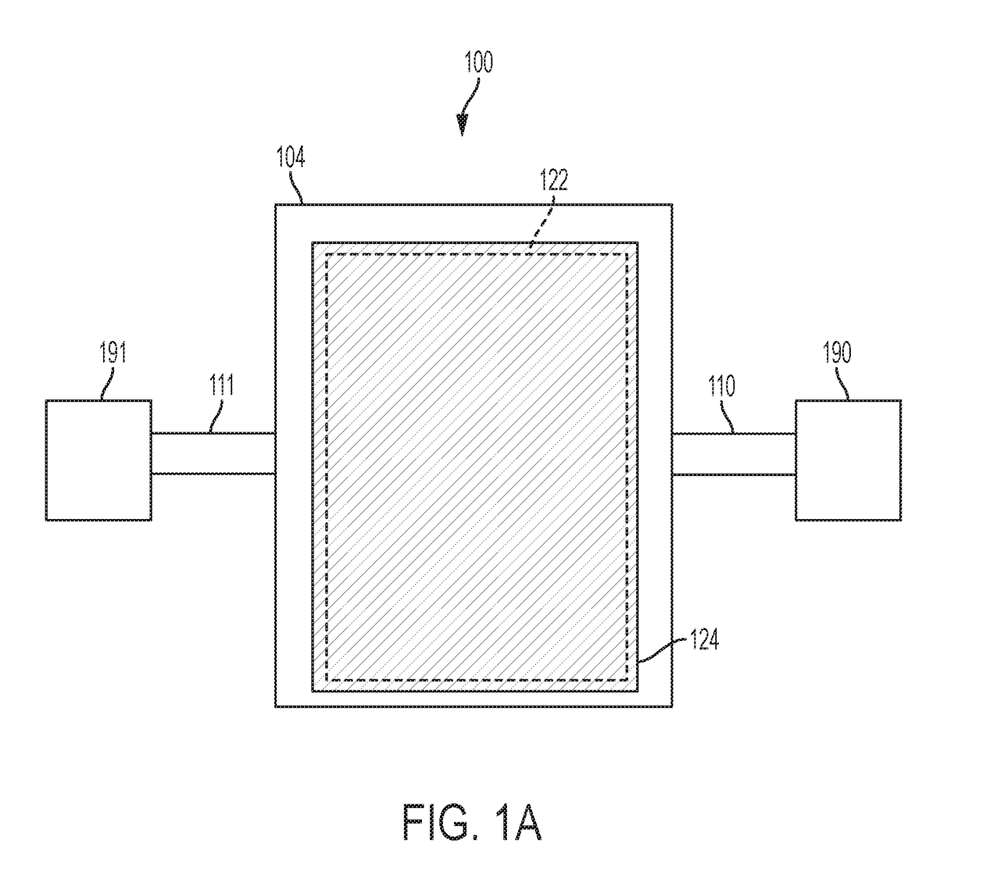
FIG. 1A is a cut-away view of a schematic diagram illustrating a deposition chamber for depositing a film according to embodiments of the invention.
Figure 1B:
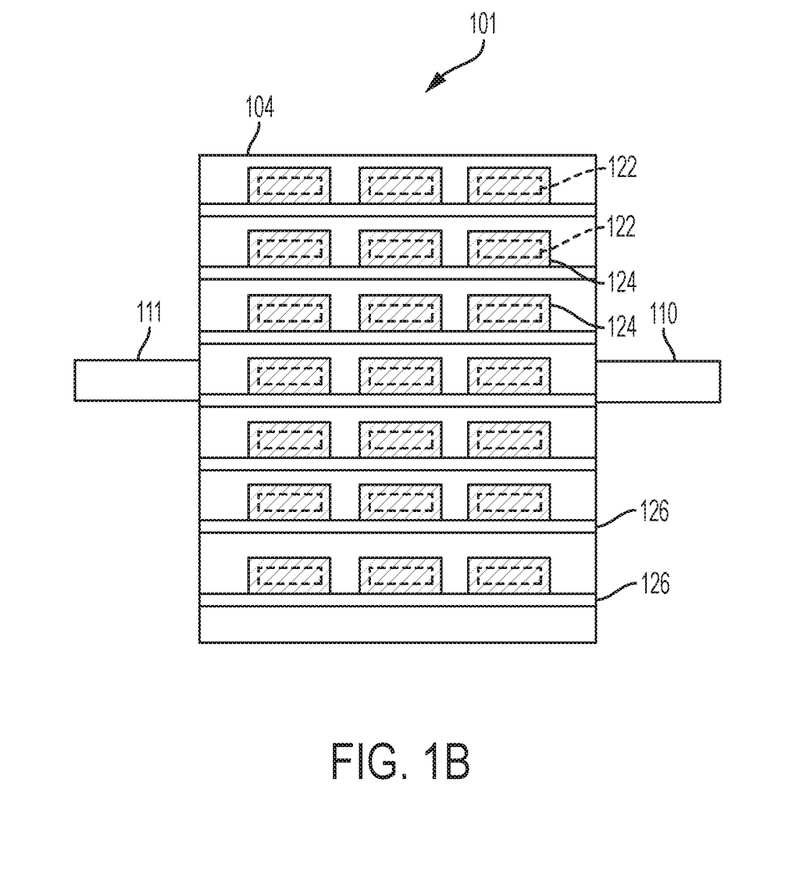
FIG. 1B is a cut-away view of a schematic diagram illustrating a deposition chamber with racks for depositing a film according to embodiments of the invention.

Turning now to a more detailed description of aspects of the present invention, FIGS. 1 and 2 are cut-away views of schematic diagrams illustrating exemplary deposition systems 100, 101 for forming a poly-p-xylylene film 124 on an object(s) 122 according to embodiments of the invention. The exemplary deposition systems 100, 101 includes a deposition chamber 104 (chamber body), which is coupled to an inlet 111 and an outlet 110. A film 124 forms on all surfaces of an object 122 arranged in the deposition chamber 104, which is shown as broken lines as only a representative schematic illustration. The film 124 is formed on all exposed surfaces of the object(s) 122, as well as on the entire inside surfaces of the deposition chamber 104. Although, for clarity, the film 124 is not shown on the internal surfaces of the deposition chamber 104 itself, and only on the object(s) 122. The object(s) 122 can have any size, shape, or dimension and is not limited to the size, shape, and dimensions shown in FIGS. 1A and 1B. The large object 122 shown in FIG. 1A is shown as only an example, and to illustrate that the entire internal volume of the deposition chamber 104 can be utilized. In other examples, the object(s) 122 could be larger or smaller than shown in FIG. 1A.

The deposition system 101 shown in FIG. 1B includes deposition chamber 104 with a plurality of racks 126 or shelves on which the plurality of objects 122 are arranged. The deposition chamber 104 can include any number or racks 126 or shelves for housing a plurality of object(s) 122. As shown, substantially the entire internal volume of the deposition chamber 104 can be used.

According to one or more embodiments, the film 124 formed is a poly-p-xylylene (Parylene), including derivatives thereof. The poly-p-xylylene has the following structure in some embodiments of the invention:

Structure 1 wherein n is an integer greater than 1, and A, B, C, and D are each, independently, a hydrogen or a halogen, such as a chlorine or fluorine.

According to some embodiments, A, C, and D are hydrogen and B is chlorine (commercially available as Parylene C). According to other embodiments, A and C are hydrogen, and B and D are chlorine (commercially available as Parylene D). According to one or more embodiments, A, B, C, and D are hydrogen (commercially available as Parylene N). Yet, according to some embodiments, A, B, C, and D are fluorine (commercially available as Parylene F).

The poly-p-xylylene film 124 polymerizes within the deposition chamber 104. The poly-p-xylylene film 124 can be formed, for example, according to the following reaction scheme (Scheme 1):

In Scheme 1 above, a precursor dimer (1) is cleaved to form a monomer (2), which is then polymerized in the deposition chamber 104 to form the poly-p-xylylene polymer (3).

According to one or more embodiments, the film 124 includes the following structure (Structure 2) (also commercially available as Parylene HT), wherein n is an integer greater than 1.

Turning again to FIG. 1A, the deposition chamber 104 includes a chamber body that is coupled to a chamber inlet 111 and chamber outlet 110. The inlet 111 couples the furnace 191 to the deposition chamber 104 body. The outlet 110 couples the vacuum pump 190 to the deposition chamber 104 body. To form the film 124, a precursor dimer is cleaved, and the resulting monomer is flowed from the furnace 191 through the inlet 111 into the deposition chamber 104. The precursor dimer can be in any form, for example, in a powder or pelletized form. The monomeric precursor is polymerized in the deposition chamber 104 to deposit the film 124 on the object(s) 122 within the chamber body. According to one or more embodiments, the film 124 is be deposited under a vacuum pressure, or a pressure range of about 20 to about 50 mTorr. The deposition chamber 104 further includes a lid or door (not shown) that can be opened to insert and remove objects, and closed and sealed to maintain a vacuum pressure.

Although the deposition chamber 104 is generally maintained about room temperature in conventional methods (e.g., 18 to 25° C.), heat emanating from the various heat sources around deposition chamber 104 result in heat being unevenly distributed within and around the chamber. Heat sources coupled to the deposition chamber 104 include, for example, the furnace, adhesion promotion units, sensors, monitors, etc. Extra (non-furnace) heat sources generally can have temperatures of about, for example, 100 to 200° C. Instead of dissipating the heat from these heat sources that come into contact with the deposition chamber 104, in accordance with embodiments of the invention, as shown in FIGS. 2A-2C, the heat within the deposition chamber 104 is evenly dispersed by including one or more heating elements that evenly control the internal temperature of the chamber from the outside of the chamber.

Figure 2A:
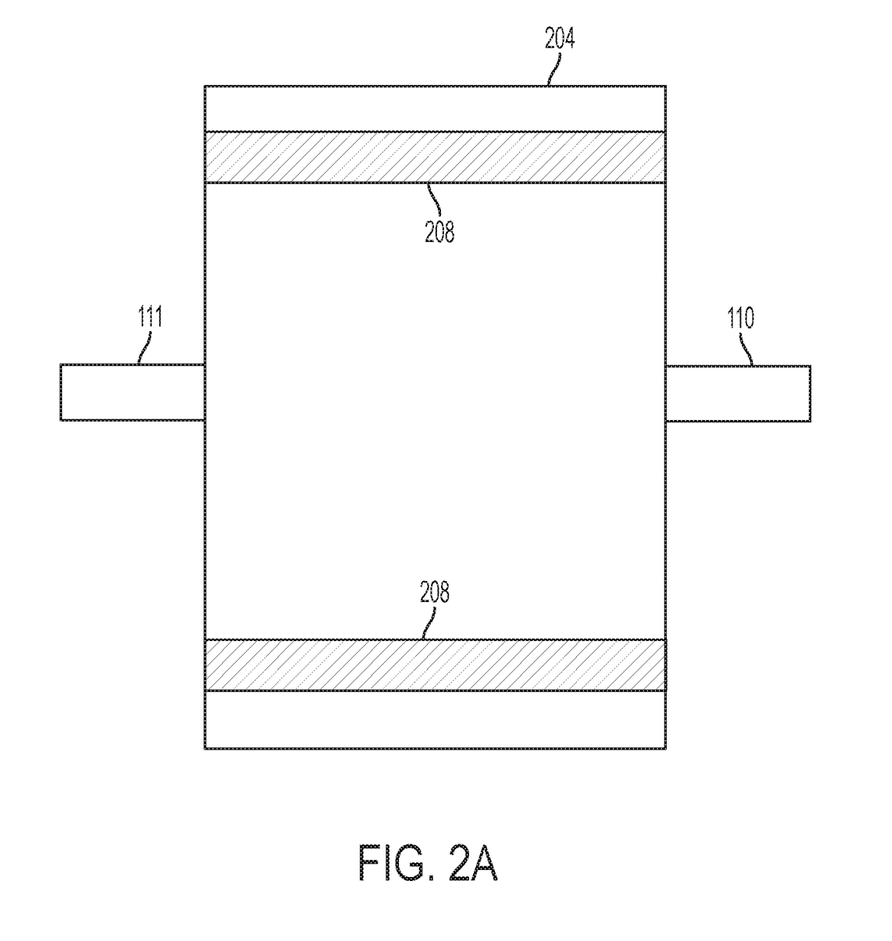
FIG. 2A is a schematic diagram illustrating a deposition chamber with heating elements according to embodiments of the invention.
Figure 2B:
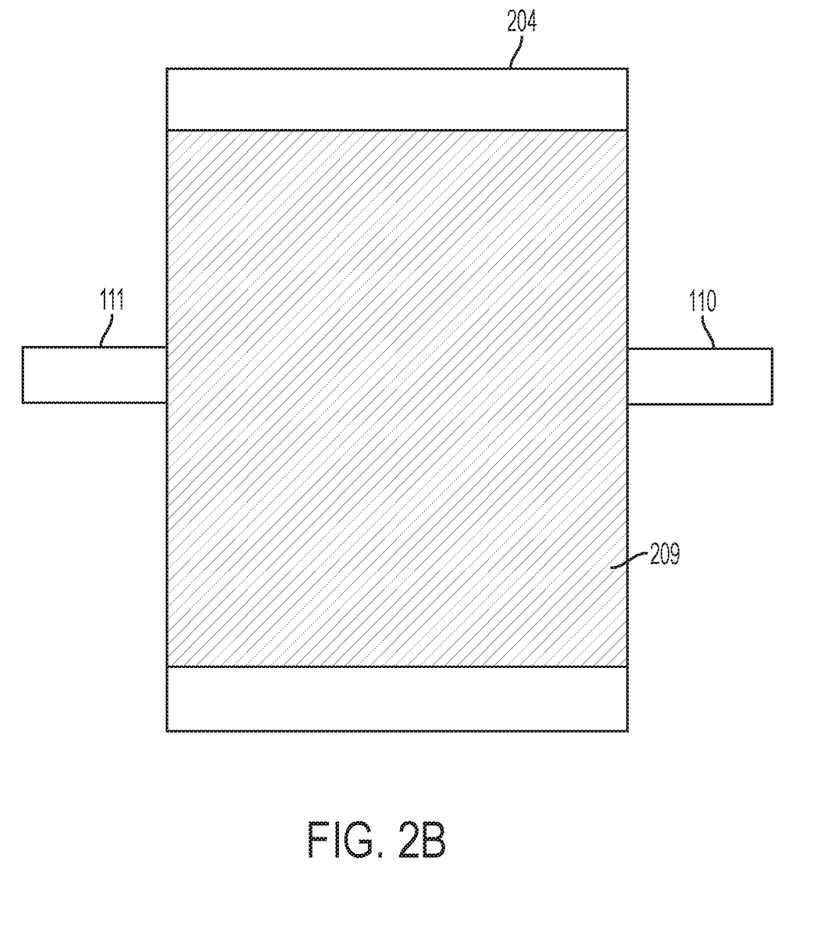
FIG. 2B is a schematic diagram illustrating a deposition chamber with a heating blanket according to embodiments of the invention.
Figure 2C:
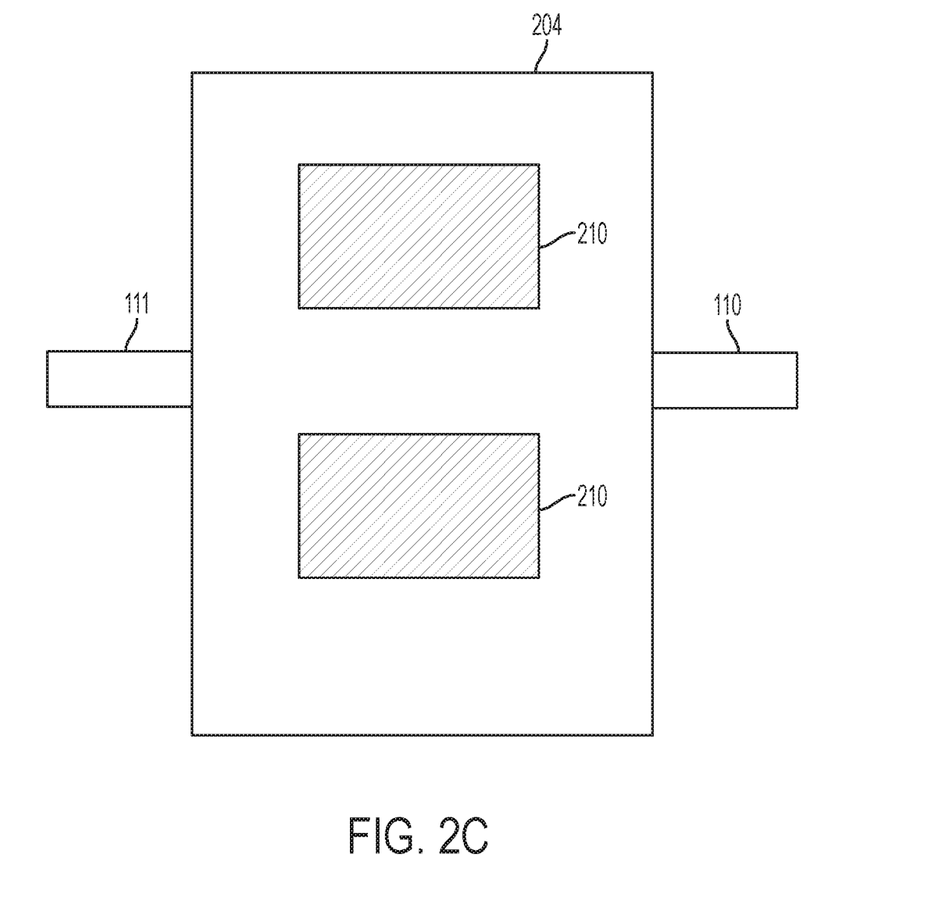
FIG. 2C is a schematic diagram illustrating a deposition chamber with heating elements according to embodiments of the invention.
Figure 3A:
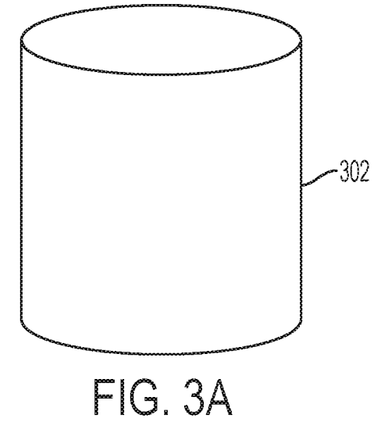
FIG. 3A is a schematic diagram illustrating a deposition chamber according to embodiments of the invention.
Figure 3B:
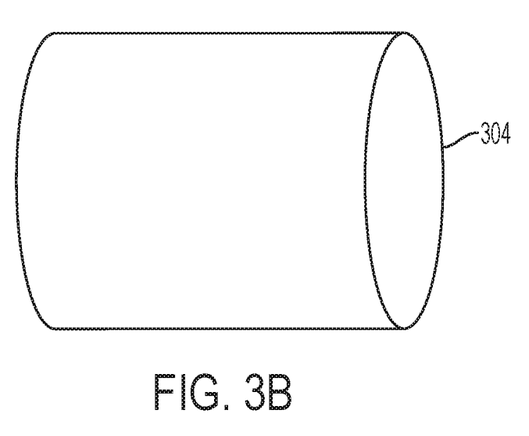
FIG. 3B is a schematic diagram illustrating a deposition chamber according to exemplary embodiments of the invention.
Figure 3C:
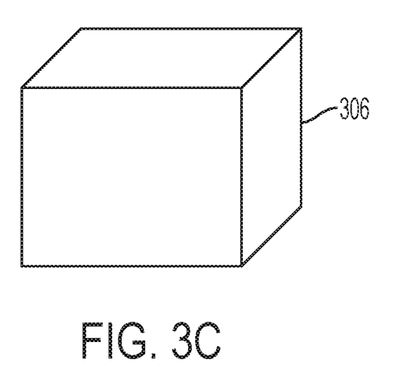
FIG. 3C is a schematic diagram illustrating a deposition chamber according to exemplary embodiments of the invention.
Figure 3D:
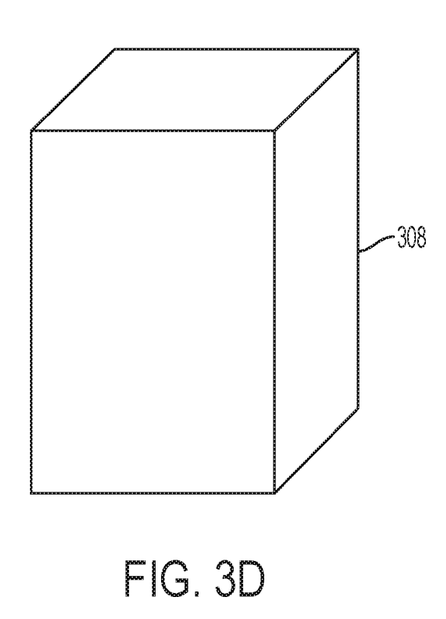
FIG. 3D is a schematic diagram illustrating a deposition chamber according to exemplary embodiments of the invention.

FIGS. 2A-2C illustrate examples of how heating elements are used to raise the internal temperature of the deposition chamber 204 to a substantially uniform temperature according to embodiments of the invention. As shown in FIG. 2A, a pair of heating elements 208 are arranged on the outside surface of the vacuum deposition chamber 204. Each heating element 208 is a band that is arranged on an external surface of the deposition chamber 204. In the example shown, a first heating element 208 is arranged on a surface of the chamber body, and a second heating element 208 is arranged on another area of the surface of the chamber body. Although two heating elements 208 are shown, any number of heating elements 208, for example, one, two, three, four, five, six, or seven, or more can be included as long as the heating elements 208 function to elevate and maintain the internal temperature of the deposition chamber 204 to a substantially uniform temperature. Elevating to a substantially uniform temperature overcomes the influence of the point heat sources that are in contact with the chamber during film deposition.

FIG. 2B illustrates another example of a heating blanket 209 that surrounds the outside chamber body of the deposition chamber 204 according to embodiments of the invention. The heating blanket 209 is a heated fluid (e.g., water) jacket in some embodiments. The heating blanket 209 provides a substantially uniform internal temperature to the deposition chamber 204. Although the heating blanket 209 is shown as covering a large proportion of the outside surface of the deposition chamber 204, the heating blanket 209 can cover less external surface area provided that the heating blanket 209 functions to maintaining a substantially uniform temperature within the entirety of deposition chamber 204.

FIG. 2C illustrates another example of heating elements 210 attached to the deposition chamber 204 according to embodiments of the invention. One or more heating elements 210 are attached to the external surface or internal surface of the deposition chamber 204. One or more heating elements 210 also can be embedded within the walls of the chamber. Although two heating elements 210 are shown, any number of heating elements of any dimensions can be used provided that they achieve a uniform heated temperature of the vacuum deposition chamber 204.

The heating elements described above are raised to a temperature of about 135 to about 155° C. to raise the external temperature of the deposition chamber. Applying heat to the outside of the chamber helps distribute the external heat sources in contact with the deposition chamber 204 to yield a substantially uniform internal temperature across the entire internal volume of the chamber. According to some embodiments, in response to raising the external temperature, the internal temperature of the chamber is raised to a temperature above room temperature, or about 25° C. In other embodiments, in response to raising the external temperature, the internal temperature of the chamber is raised to a temperature in a range from about 25 to about 40° C. Yet, in some embodiments, in response to raising the external temperature, the internal temperature of the chamber is raised to about 30 to about 40° C. The internal temperature of the chamber is substantially uniform, or has a temperature variation within (about or less than) ±5° C. according to some embodiments.

Advantages of the described modification to the deposition chamber 204 include increasing the space within the chamber that can be utilized for uniform film deposition. Nearly 100% of the internal volume of the deposition chamber 204 can be used. Increased utilization enables larger runs and the ability to coat large three dimensional assemblies with excellent uniformity.

Turning again to FIGS. 1A and 1B, the object(s) 122 (or parts) to be coated can have any shape or size and include any number of parts because the entire volume inside the deposition chamber 104 can be used. The methods and devices can be used in small scale research as well as large scale production.

As mentioned above, the size, shape, and orientation of the deposition chamber also are not limited and can be any shape or size. Non-limiting examples of shapes for the chamber include a cylinder, cube, rectangular prism, cone, pyramid, sphere, prism, or a combination thereof. FIGS. 3A-3D illustrate non-limiting examples of shapes and orientations for the deposition chamber. The deposition chamber 302, 304, 306, 308 can have a cylindrical shape (FIGS. 3A and 3B), a cubic shape (FIG. 3C), or a rectangular prism shape (FIG. 3D), or a combination of any of these shapes for example. However, it is noted that the size, shape, and orientation of the deposition chamber are not limited to these shapes, or even combinations of shapes, and the shape, dimension and orientation of the deposition chamber can be tailored to the specific desired application.

Increasing the internal temperature of the chamber to a uniform temperature provides a substantially uniform coating or film on any object(s). The thickness of the film formed on the object(s) is not intended to be limited. According to some embodiments, the thickness of the film is about 0.1 micrometers to about 10 micrometers. Being able to form a poly-p-xylylene film on any substrate with a substantially uniform thickness allows for coating large, including three dimensional, objects with tailorable RF properties. According to one or more embodiments, the thickness of the film is controlled such that the thickness of a film across the entire internal volume of the chamber is within 6%. The thickness uniformity is an improvement over known methods, which have a thickness non-uniformity of about 32% (see Examples below).

EXAMPLES

Figure 4A:
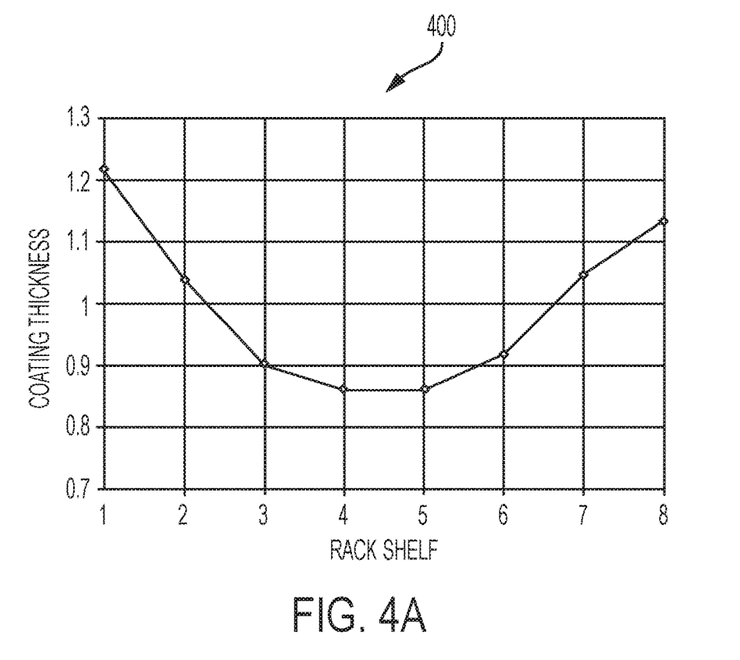
FIG. 4A is a graph illustrating coating thickness of a comparative film formed by known methods.
Figure 4B:
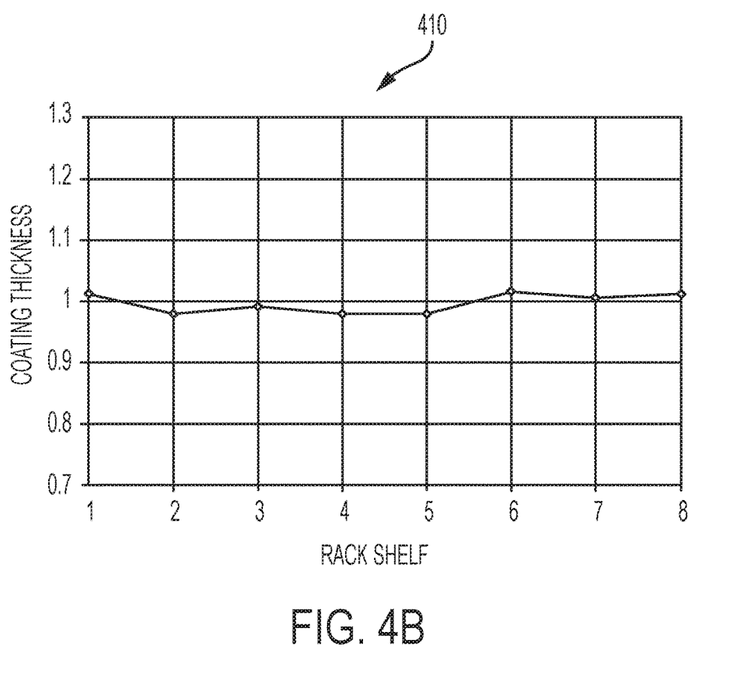
FIG. 4B is a graph illustrating uniform coating thickness of a film formed according to embodiments of the invention.
Figure 5A:
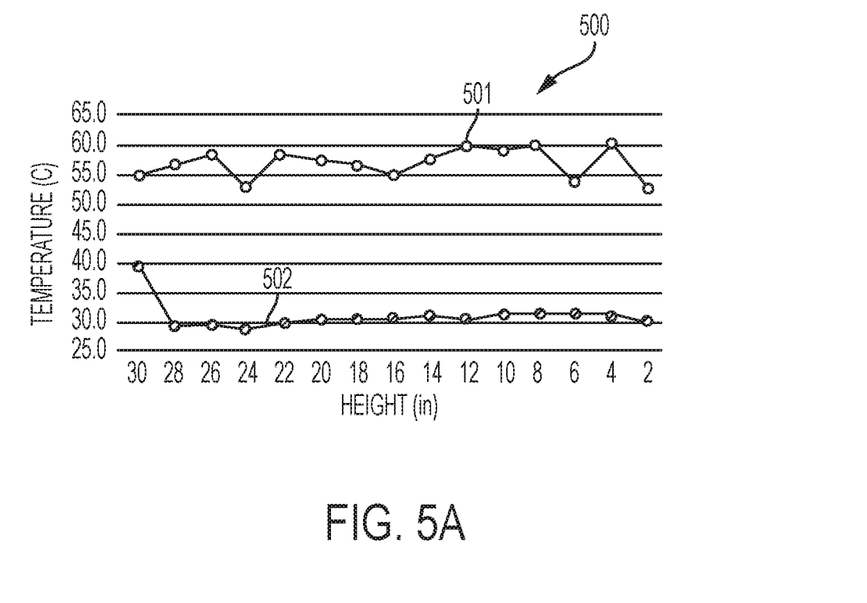
FIG. 5A is a graph illustrating temperature variations within a deposition chamber according to known methods.
Figure 5B:
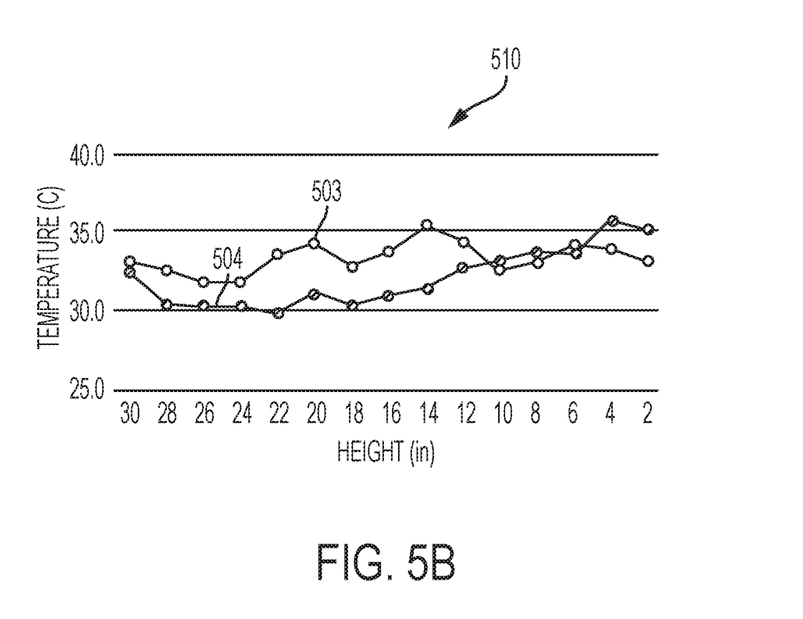
FIG. 5B is a graph illustrating temperature within a deposition chamber according to embodiments of the invention.

The following Examples compare coating thickness and vacuum chamber temperature of Parylene films formed by known CVD methods (FIGS. 4A and 5A, respectively) and by the inventive methods (FIGS. 4B and 5B, respectively). In FIGS. 4A and 4B, the rack shelf position on the x-axis represents the relative position within the deposition chamber. The normalized coating thickness is shown in the y-axis. As shown, the thickness of the film in graph 400 (FIG. 4A) varied substantially, with the coating non-uniformity being 31.8%. However, the thickness of the film in graph 410 (FIG. 4B) was substantially uniform, with the coating non-uniformity being 5.8%.

In graphs 500 and 510 in FIGS. 5A and 5B, respectively, the height (inches) on the x-axis represents the relative position within the chamber, which is compared to temperature (° C.) inside the deposition chamber on the y-axis. In FIG. 5A, trace 501 was the temperature at the inlet wall, and trace 502 was the temperature at the back of the chamber. As shown, the temperature varied significantly within the chamber, with a ΔT of 31° C. Yet, graph 510 in FIG. 5B illustrates the temperature in the deposition chamber when raised to a uniform temperature according to embodiments of the invention. Trace 503 was the temperature at the inlet wall. Trace 504 was the temperature at the back of the chamber. As shown, the temperature was substantially uniform within the chamber, with a ΔT of 6.5° C.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A deposition chamber for forming a poly-para-xylylene film, the deposition chamber comprising:
   a chamber body;

an inlet coupling the chamber body to a furnace containing a poly-para-xylylene precursor monomer;

an outlet coupling the chamber body to a vacuum pump;

a heater mounted directly on an exterior outside surface of the chamber body, the heater configured to raise an internal temperature of an entire internal volume of the chamber body to a substantially uniform internal temperature across the entire internal volume of the chamber body; and a plurality of shelves arranged within an interior inside surface of the chamber body, each shelf of the plurality of shelves being a horizontal surface for holding a plurality of objects onto which the poly-para-xylylene film is deposited, each shelf extending continuously from a first interior surface to a second interior surface of the chamber body, and the horizontal surfaces stacked in a vertical arrangement and in parallel to one another.

2. The deposition chamber of claim 1, wherein the substantially uniform internal temperature is about 30 to about 40° C.

3. The deposition chamber of claim 1, wherein the heater comprises a heating band, a fluid jacket, a heating blanket, or a combination of any of the foregoing elements.

4. The deposition chamber of claim 1, wherein the heater applied to the deposition chamber is raised to a temperature of about 135 to about 155° C.

5. The deposition chamber of claim 1, wherein the substantially uniform internal temperature is above room temperature.

6. The deposition chamber of claim 1, wherein the substantially uniform temperature varies by less than ±5° C.

7. The deposition chamber of claim 1, wherein an entire internal volume of the chamber body varies by less than ±5° C.

8. A deposition chamber for forming a poly-para-xylylene film, the deposition chamber comprising:

a chamber body;

an inlet coupling the chamber body to a furnace containing a poly-para-xylylene precursor monomer;

an outlet coupling the chamber body to a vacuum pump;

a heater mounted directly on an exterior outside surface of the chamber body, the heater configured to raise an entire internal volume of the chamber body to a substantially uniform internal temperature across the entire internal volume of the chamber body; and a plurality of shelves arranged within an interior inside surface of the chamber body, each shelf of the plurality of shelves being a horizontal surface for holding a plurality of objects onto which the poly-para-xylylene film is deposited, each shelf extending continuously from a first interior surface to a second interior surface of the chamber body, and the horizontal surfaces stacked in a vertical arrangement and in parallel to one another; and an object on a shelf of the plurality of shelves.

* * * * *